United States Patent
Seo et al.

(10) Patent No.: US 7,619,281 B2
(45) Date of Patent: Nov. 17, 2009

(54) SEMICONDUCTOR DEVICE HAVING BURIED GATE LINE AND METHOD OF FABRICATING THE SAME

(75) Inventors: Hyeoung-Won Seo, Yongin-si (KR); Young-Woong Son, Hwaseong-si (KR); Kang-Yoon Lee, Seongnam-si (KR); Bong-Soo Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 51 days.

(21) Appl. No.: 11/797,137

(22) Filed: May 1, 2007

(65) Prior Publication Data
US 2008/0079070 A1    Apr. 3, 2008

(30) Foreign Application Priority Data
Oct. 2, 2006 (KR) .................. 10-2006-0097267

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .................. 257/330; 257/328; 257/329; 257/331; 257/332; 257/333; 257/334; 257/E29.13; 257/E29.134

(58) Field of Classification Search ......... 257/328–334, 257/E29.13, E29.134
See application file for complete search history.

(56) References Cited

U.S. PATENT DOCUMENTS

| | | | |
|---|---|---|---|
| 6,177,698 B1 * | 1/2001 | Gruening et al. ............ 257/302 |
| 6,713,814 B1 * | 3/2004 | Koscielniak ................ 257/330 |
| 6,770,535 B2 | 8/2004 | Yamada et al. |
| 7,033,869 B1 * | 4/2006 | Xiang et al. ................ 438/149 |
| 7,148,527 B2 * | 12/2006 | Kim et al. .................... 257/288 |
| 7,166,514 B2 * | 1/2007 | Kang et al. ................. 438/296 |
| 7,221,020 B2 * | 5/2007 | Tran ........................... 257/330 |
| 7,285,466 B2 * | 10/2007 | Kim et al. .................... 438/270 |
| 7,384,849 B2 * | 6/2008 | Parekh et al. ............... 438/270 |
| 2002/0096714 A1 * | 7/2002 | Zeng et al. .................. 257/342 |
| 2003/0011032 A1 * | 1/2003 | Umebayashi ............... 257/368 |
| 2005/0001252 A1 * | 1/2005 | Kim et al. .................... 257/296 |
| 2007/0072375 A1 * | 3/2007 | Yamazaki .................... 438/270 |
| 2007/0170511 A1 * | 7/2007 | Huang ......................... 257/355 |
| 2008/0001218 A1 * | 1/2008 | Kim et al. .................... 257/330 |
| 2008/0054259 A1 * | 3/2008 | Glunz et al. ................. 257/41 |
| 2008/0164507 A1 * | 7/2008 | Chang et al. ................ 257/312 |

FOREIGN PATENT DOCUMENTS

KR    101998079068 A    11/1998

(Continued)

Primary Examiner—Ida M Soward
(74) Attorney, Agent, or Firm—Volentine & Whitt, PLLC

(57) ABSTRACT

A semiconductor device having a buried gate line with a shaped gate trench and a method of fabricating the same are disclosed. The semiconductor device includes a trench isolation layer provided in a semiconductor substrate to define a multi-surfaced active region/channel. A gate line extending to the trench isolation layer fills a portion of the gate trench. The gate trench is formed with a series of depressions to accommodate peaks in the channel. The combination of depressions/peaks operate to increase the effective area of the channel, thereby enabling smaller channel semiconductor devices to be formed without increasing the width thereof.

14 Claims, 10 Drawing Sheets

| | FOREIGN PATENT DOCUMENTS | | |
|---|---|---|---|
| KR | 1020050015975 A | 2/2005 | |
| KR | 1020050060857 A | 6/2005 | |
| KR | 1020050079270 A | 8/2005 | |
| KR | 1020060039366 A | 5/2006 | |
| KR | 1020060046909 A | 5/2006 | |

* cited by examiner

SEMICONDUCTOR DEVICE HAVING BURIED GATE LINE AND METHOD OF FABRICATING THE SAME

BACKGROUND

1. Field of the Invention

The invention relates generally to a semiconductor device and a method of fabricating same. More particularly, this invention relates to a semiconductor device having a buried gate line and a method of fabricating same.

This application claims priority to Korean Patent Application No. 10-2006-0097267, filed Oct. 2, 2006, the contents of which are hereby incorporated herein by reference in its entirety.

2. Description of Related Art

Semiconductor devices widely employ a discrete device such as a field effect transistor as a switching device. In the transistor, the operating speed of the switching device is significantly determined by the on current flowing through a channel between the source and drain regions. In general, a planar-type transistor may be formed by fabricating a gate electrode and the source and drain regions in a device-forming region of a substrate, i.e., an active region. Common planar-type transistors have a planar channel between the source and drain regions. The on-current of the planar-type transistor is proportional to the width of the active region, and inversely proportional to the distance between the source region and the drain region, i.e., a gate length. Thus, in order to increase the on-current and thus the operating speed of the device, the gate length has to be reduced, and the width of the active region has to be increased. However, the increase in the width of the active region in the planar-type transistor is contrary to the trend of reducing the size of highly integrated devices. Also, in the planar-type transistor, as the distance between the source and drain regions becomes short, a short channel effect may occur. Accordingly, because a conventional planar-type transistor contains a flat channel on the surface of the semiconductor substrate and is a planar-type channel device; it is structurally disadvantageous to downsize the device, without also incurring the short channel effect.

A transistor having a recess channel has been disclosed to overcome the short channel effect for a downsized transistor. The recess channel transistor contains a depressed channel region and an insulated gate electrode. The insulated gate electrode is disposed in the depressed channel region, i.e., a recess channel region. Accordingly, the recess channel transistor may ensure a relatively greater effective channel length than the planar-type transistor. That is, the recess channel transistor provides a structure capable of overcoming problems caused by the short channel effect. However, the recess channel transistor has another problem that makes subsequent processes such as formation of a contact plug and planarization difficult when the gate electrode is disposed to project upward from the semiconductor substrate. Also, an upper corner part of the depressed channel region may result in leakage current from a field crowding effect. Further, a highly difficult patterning process is required to form the projected gate electrode.

Another approach using a buried word line is disclosed in U.S. Pat. No. 6,770,535 B2 entitled "Semiconductor Integrated Circuit Device and Process for Manufacturing the Same" by Yamada et al. According to Yamada et al., a trench is formed across a channel region and an isolation layer. A word line filling a part of the trench is then formed. An insulating pattern filling the rest of the trench is formed thereafter. As a result, the world line is buried under the surface of the semiconductor substrate. The buried word line provides a relatively greater effective channel length. However, the effective channel width of the semiconductor device is determined by the channel region and the buried word line. Accordingly, this semiconductor device has substantially the same effective channel width as a planar-type MOS transistor. Consequently, the buried word line semiconductor device has a relatively lower current drivability than the planar-type MOS transistor. Also, the recess channel MOS transistor has a relatively adverse body effect as well as a difficult structure as compared to the planar-type MOS transistor.

Therefore, there is a need in the semiconductor arts for a semiconductor device capable of substantially overcoming the deficiencies described above and a method of fabrication, thereof.

SUMMARY OF THE INVENTION

Embodiments of the present invention provide systems and methods for increasing the effective channel length and width of a semiconductor device.

In one aspect of the invention, a semiconductor device is provided having a trench isolation layer disposed on a semiconductor substrate defining an active region, a gate trench extending from the trench isolation layer is disposed in the active region, the gate trench having a first region proximal to the trench isolation layer and a second region proximal to the first region, wherein a bottom of the second region is at a level lower than a bottom of the first region, a gate line across the active region fills a portion of the gate trench, and an insulating pattern is provided on the gate line.

In another embodiment of the present invention, an upper width of the active region is smaller than a lower width of the active region, the widths being substantially defined by an inclined sidewall of the trench isolation layer. An upper portion of the first region may be at a greater height than an upper portion of the second region. The upper width of the active region may be greater than the lower width of the active region.

In other embodiments of the present invention, the gate trench has a third region projecting from a central region of the second region, wherein an upper portion of the third region is at a greater height than the upper portion of the second region. The gate line may also cover a sidewall of the active region.

In still other embodiments, the invention may further comprise a gate dielectric layer interposed between the gate line and the active region. It may also further comprise source and drain regions provided in the active region adjacent to both sides of the gate line, upper surfaces of the source and drain regions being disposed at a higher level than the gate line. The upper surfaces of the source and drain regions and the insulating pattern may be disposed at the same level. Also, it may further comprise a data storage element electrically connected to one of the source and drain regions.

In another aspect, methods for fabricating a semiconductor device is provided, the method comprising, forming a trench isolation layer defining an active region in a semiconductor substrate, forming a gate trench extending from the trench isolation layer in the active region, the gate trench being formed with a first region proximal to the trench isolation layer and a second region proximal to the first region, wherein a bottom of the second region is at a lower level than a bottom of the first region, forming a gate line across the active region, and filling a portion of the gate trench, and forming an insulating pattern on the gate line.

In another embodiment of the present invention, the forming of the trench isolation layer may comprise, forming an isolation trench having an inclined sidewall to define the active region, an upper width of the active region being smaller than a lower width of the active region, forming an isolation insulating layer on the substrate with the isolation trench, and planarizing the isolation insulating layer. Additionally, forming the gate trench may comprise, forming a mask having an opening extending to the trench isolation layer across the active region on the substrate having the trench isolation layer, etching the active region using the mask and the trench isolation layer as etch masks, etching the trench isolation layer using the mask as an etch mask, and removing the mask.

In other embodiments, the gate trench in the active region is formed with an inclined sidewall, a lower region of the gate trench being narrower than an upper region thereof. Additionally, the gate trench can be formed to expose a sidewall of the active region.

In still other embodiments, the gate trench is formed to have a third region projecting from a central portion of the second region.

In yet another embodiment, the gate trench is formed by forming a mask having an opening extending to the trench isolation layer across the active region on the substrate having the trench isolation layer, partially etching the trench isolation layer using the mask and the active region as etch masks, etching the active region using the mask and the partially etched trench isolation layer as etch masks, and removing the mask.

In other embodiments of the present invention, the method of fabrication includes etching the partially etched trench isolation layer, after etching the active region, by using the mask as an etch mask to expose the sidewall of the active region. Additionally, the method may include forming a gate dielectric layer, before forming the gate line, on the substrate. The method may further include forming source and drain regions in the active region adjacent to both sides of the gate line, upper surfaces of the source and drain regions being disposed at a higher level than the gate line.

In yet another embodiment, an interlayer insulating layer on the substrate having the source and drain regions is formed and a contact plug passing through the interlayer insulating layer is formed, wherein the contact plug is in contact with at least one of the source and drain regions, and a data storage element is formed above the contact plug on the interlayer insulating layer.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DESCRIPTION OF EMBODIMENTS

Embodiments of the invention will be described in some additional detail with reference to the accompanying drawings. The present invention may, however, be embodied in different forms and should not be constructed as limited to only the embodiments set forth herein. Rather, these embodiments are presented as teaching examples. Throughout the written description and drawings, like reference numbers and symbols refer to like or similar elements.

Certain drawing dimensions, particularly those related to elements, layers and regions of the exemplary interconnects described below may have been exaggerated for clarity. It will also be understood that when a layer is referred to as being 'on' another layer, element, or region, it may be "directly on" the other layer, element, or region, or intervening layers may also be present. Further, it will be understood that when a layer is referred to as being 'under' another layer, it may be "directly under", or one or more intervening layers may be present. In addition, it will also be understood that when a layer is referred to as being 'between' two layers, elements, or regions, it may be the only layer there between, or one or more intervening layers may also be present.

Moreover, terms such as "first," and "second" are used to describe various layers, elements, and regions in various embodiments of the invention, but such terms do not temporally or sequentially limit (e.g., in an order of formation) the related layers, elements, and regions. Rather, these terms are used merely to distinguish one layer, element or region from another.

Figure 1:
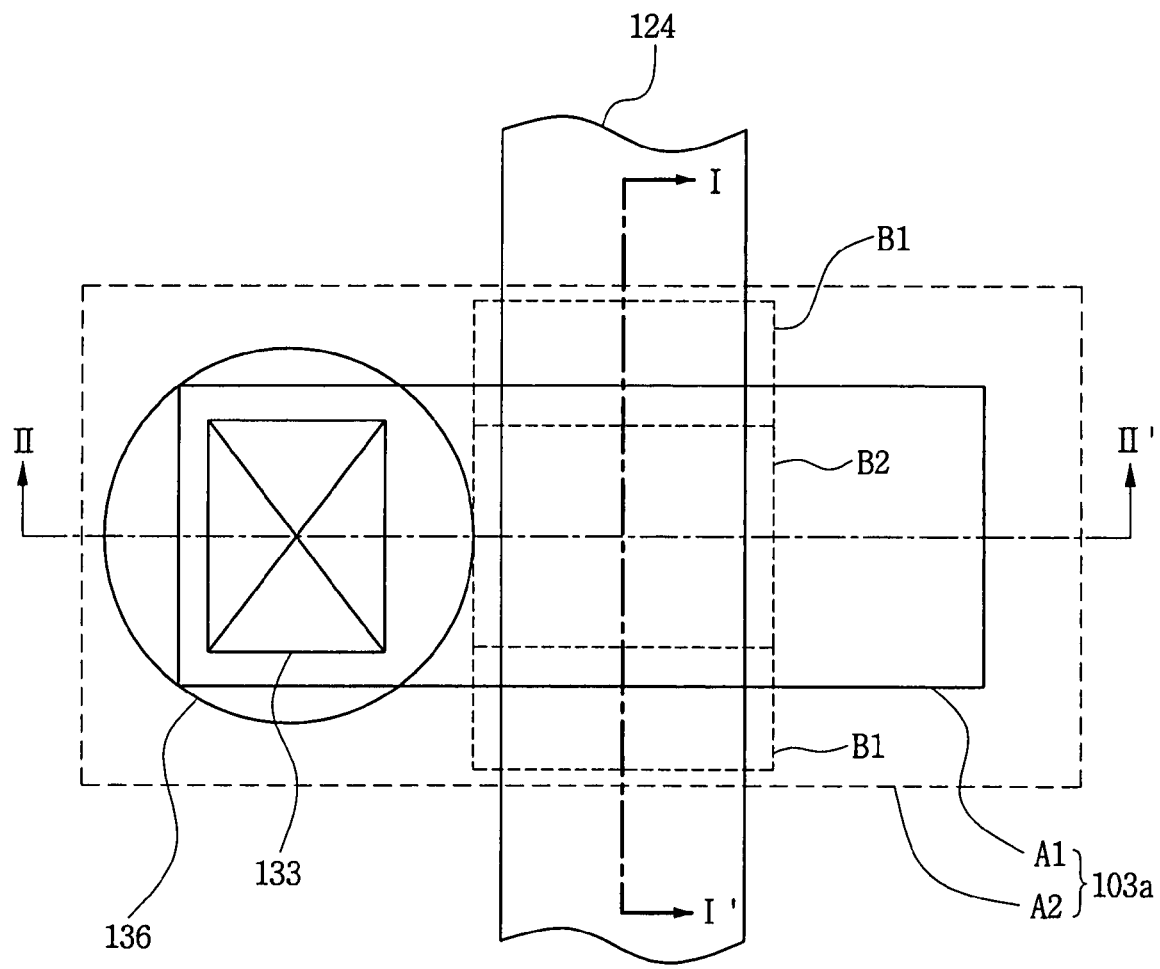
FIG. 1 is a plan view of a semiconductor device having a buried gate line according to an exemplary embodiment of the invention.

FIG. 1 is a plan view of a semiconductor device having a buried gate line according to an exemplary embodiment of the invention, FIGS. 2A, 3A, 4A and 5A are cross-sectional views taken along line I-I' of FIG. 1 which illustrate a method of fabricating the semiconductor device having a buried gate line according to an exemplary embodiment of the invention, and FIGS. 2B, 3B, 4B and 5B are cross-sectional views taken along line II-II' of FIG. 1 which illustrate a method of fabricating the semiconductor device having a buried gate line according to an exemplary embodiment of the invention. FIG. 6 is a plan view of a semiconductor device having a buried gate line according to another exemplary embodiment of the invention, FIGS. 7 to 10 are cross-sectional views taken along line III-III' of FIG. 6, and FIG. 11 is a cross-sectional view taken along line IV-IV' of FIG. 6.

First, a semiconductor device according to an exemplary embodiment of the invention will be described with reference to FIGS. 1, 5A and 5B.

Figure 5A:
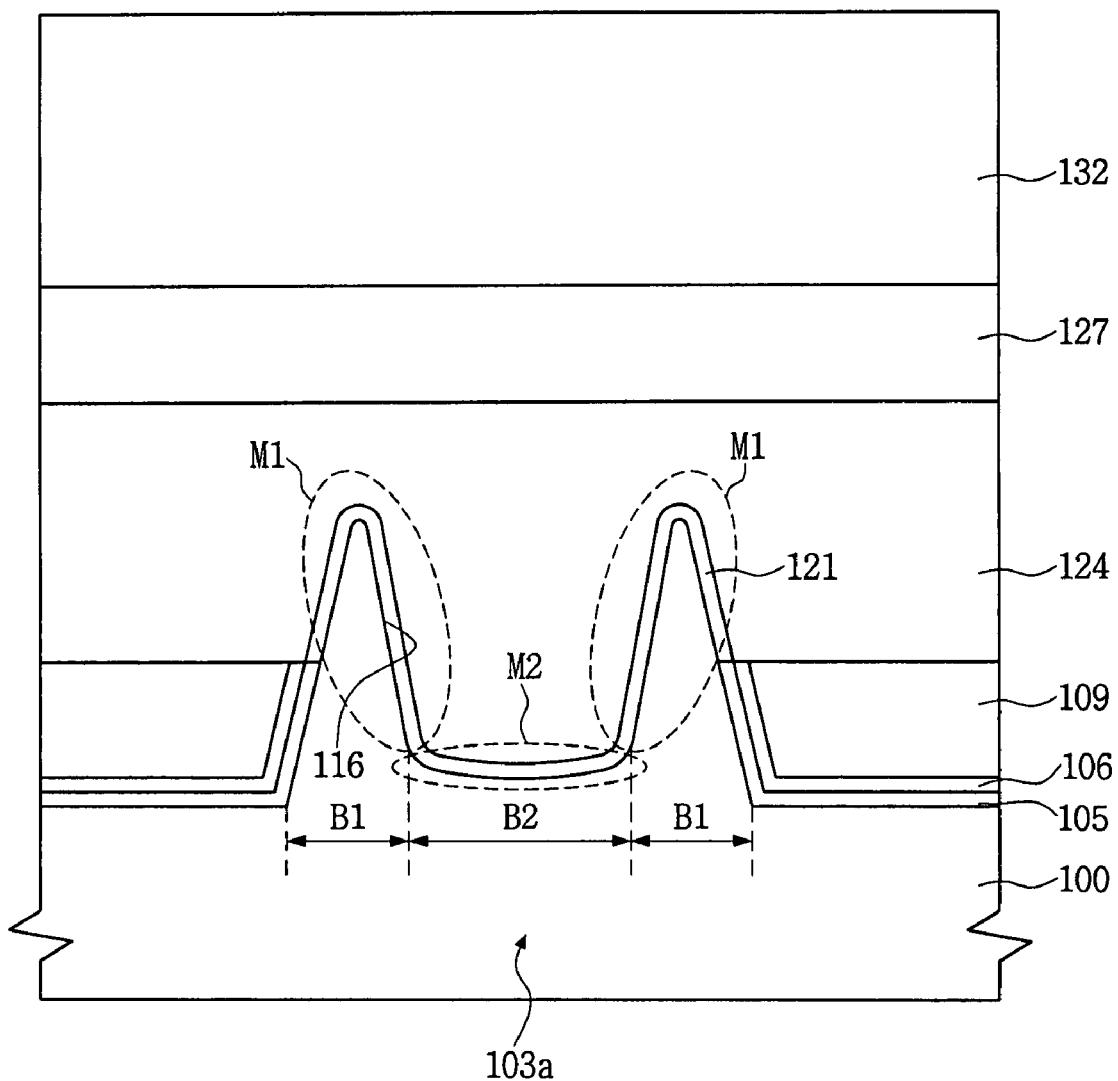
Figure 5B:
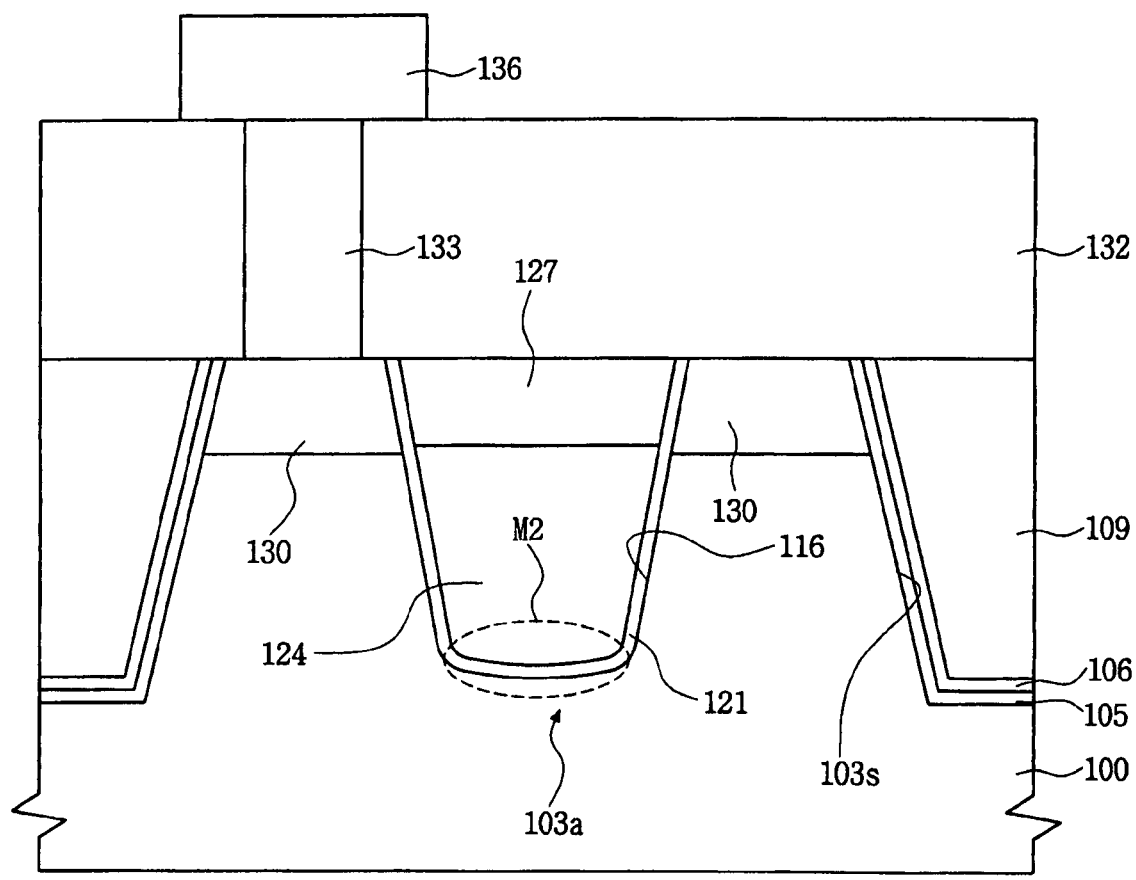
Figure 6:
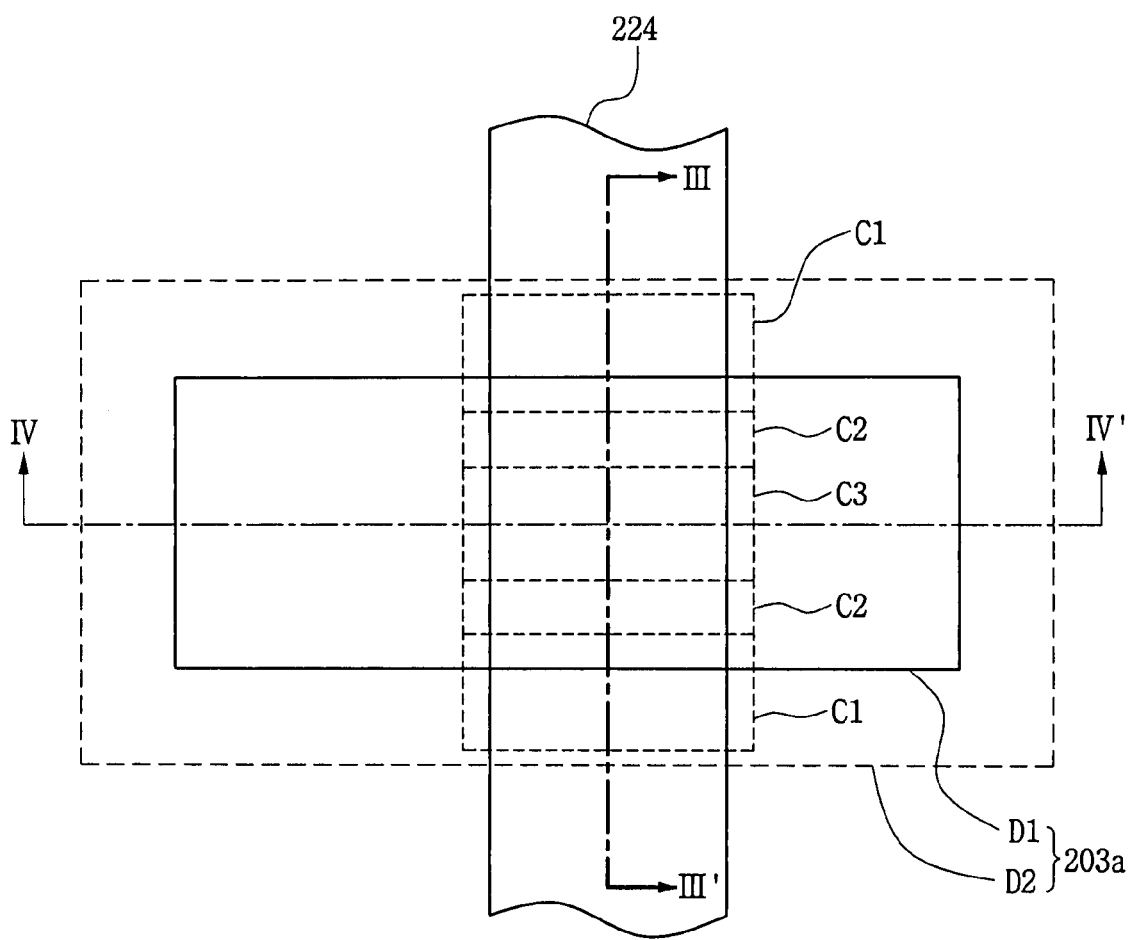
FIG. 6 is a plan view of a semiconductor device having a buried gate line according to another exemplary embodiment of the invention.

Referring to FIGS. 1, 5A and 5B, a trench isolation layer 109 defining an active region 103a is provided in a semiconductor substrate 100. The semiconductor substrate 100 may be a single crystal silicon wafer or any material that is exhibits the appropriate semiconductor-like characteristics, whether single crystal or otherwise. The trench isolation layer 109 may have an inclined sidewall. For example, the trench isolation layer 109 may have the inclined sidewall to define the active region 103a having an area gradually becoming larger from top to bottom. The trench isolation layer 109 may be, for example, a silicon oxide layer. That is, as illustrated in FIG. 1, an upper region of the active region 103a may have an area of A1, and a lower region of the active region 103a may have an area of A2 larger than A1.

Further, a buffer oxide layer 105 and an insulating liner 106 which are sequentially stacked may be provided between the trench isolation layer 109 and the semiconductor substrate 100. The buffer oxide layer 105 may be, for example, a thermal oxide layer. The insulating liner 106 may be, for example, a silicon nitride layer.

A gate trench 116 extending to the trench isolation layer 109 across the active region 103a may be provided. The gate trench 116 may have a first bottom region M1 in the active region 103a adjacent to the trench isolation layer 109, and a second bottom region M2 disposed at a lower level than the first bottom region M1 in the active region 103a adjacent to the first bottom region M1. As illustrated in FIG. 5B, the gate trench 116 may have an inclined sidewall in order to have a lower region having a smaller area than the upper region in the active region 103a. Thus, a first region B1 of the active region 103a corresponding to the first bottom region M1 of the gate trench 116 may be more projected with respect to a particular direction than a second region B2 of the active region 103a corresponding to the second bottom region M2.

The gate trench 116 may have a bottom region disposed at a lower level than the first bottom region B1 in the trench isolation layer 109.

A buried gate line 124 partially filling the gate trench 116 is provided. The gate line 124 may include one selected from the group comprising a poly silicon layer, a metal silicide layer, a metal layer, and a combination thereof. Other materials or combinations or groups may be used as deemed appropriate. The gate line 124 may cover a sidewall of the active region 103a.

A gate dielectric layer 121 may be interposed between the gate line 124 and the active region 103a. The gate dielectric layer 121 may be a silicon oxide layer or a high-k dielectric layer.

Source and drain regions 130 may be provided in the active region 103a adjacent to both sides of the gate line 124. Upper surfaces of the source and drain regions 130 may be disposed at a higher or elevated level than the gate line 124. An insulating pattern 127 may be provided on the gate line 124. The insulating pattern 127 may be, for example, a silicon oxide layer. Upper surfaces of the source and drain regions 130 and insulating pattern 127 may be disposed at substantially the same level.

The gate line 124 in the active region 103a may function as a gate electrode of a MOS transistor. Thus, a MOS transistor having the gate line 124, the gate dielectric layer 121 and the source and drain regions 130 may be provided. Such a MOS transistor may have a greater effective channel length than a planar-type transistor since it has a recessed channel. Also, the gate trench 116 in the active region 103a covered by the gate line 124 has the first and second bottom regions M1 and M2 disposed at different levels from each other, and thus may have a double-fin structure. That is, the MOS transistor may have a greater effective channel width than a planar-type transistor since it has a fin structure. As a result, according to an exemplary embodiment of the invention, a MOS transistor which can improve on-current characteristics, body effect, and sub-threshold swing characteristics of a transistor as well as a short channel effect may be realized.

An interlayer insulating layer 132 may be provided on the substrate having the MOS transistor. The interlayer insulating layer 132 may be, for example, a silicon oxide layer. A contact plug 133 passing through the interlayer insulating layer 132 and electrically connected to one of the source and drain regions 130 may also be provided. The contact plug 133 may be formed of a conductive material such as, for example, polysilicon or tungsten. A data storage element 136 covering the contact plug 133 may be provided on the interlayer insulating layer 132. The data storage element 136 may be a data storage unit of a volatile memory device such as a DRAM or a data storage unit of a nonvolatile memory device such as a PRAM. For example, when the data storage element 136 is employed in the DRAM, the data storage element 136 may be a cell capacitor of the DRAM. Other elements, whether storage-capable or not may be implemented according to design preference.

Next, a semiconductor device according to another exemplary embodiment of the invention will be described with reference to FIGS. 6, 10 and 11.

Figure 10:
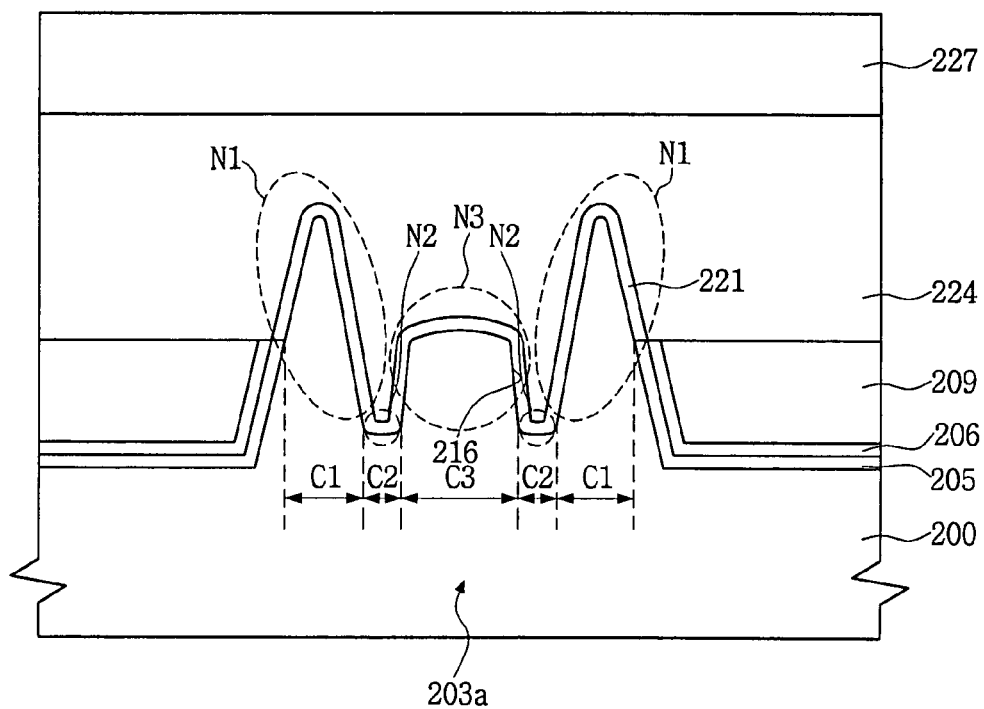
Figure 11:
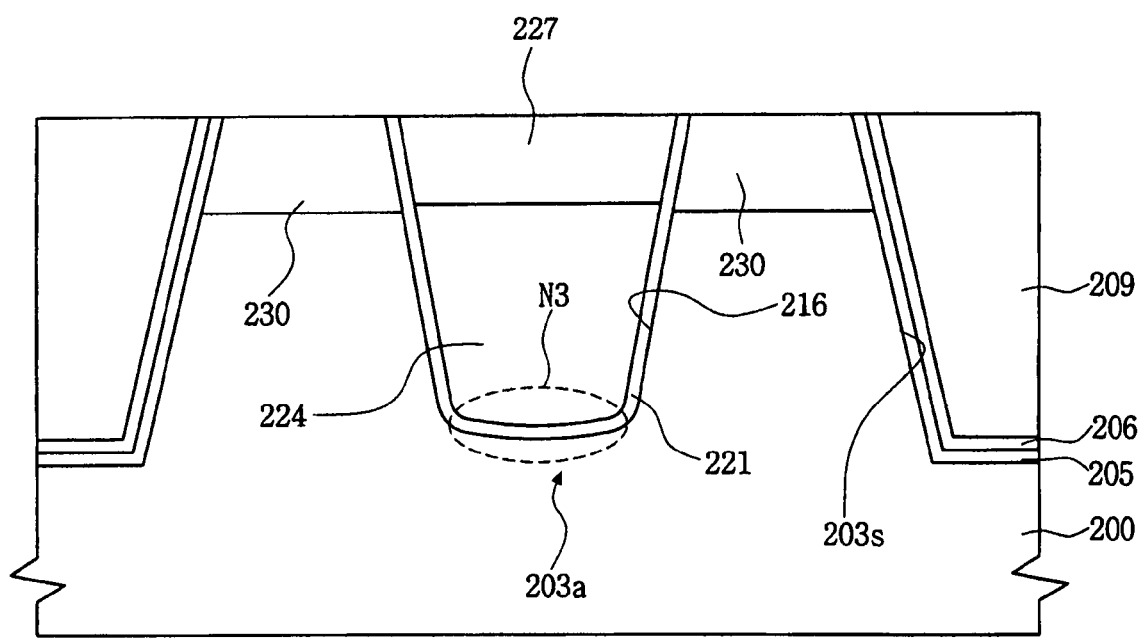

Referring to FIGS. 6, 10 and 11, a trench isolation layer 209 defining an active region 203a is provided on a semiconductor substrate 200. The semiconductor substrate 200 may be a single crystal silicon wafer or any material that is exhibits the appropriate semiconductor-like characteristics, whether single crystal or otherwise. The trench isolation layer 209 may have an inclined sidewall. For example, the trench isolation layer 209 may have an inclined sidewall to define the active region 203a having an area gradually becoming larger from top to bottom. That is, as illustrated in FIG. 6, an upper region of the active region 203a may have an area of D1, and a lower region of the active region 203a may have an area of D2 larger than D1.

The trench isolation layer 209 may be, for example, a silicon oxide layer. Here, a buffer oxide layer 205 and an insulating liner 206 may be sequentially stacked between the trench isolation layer 209 and the semiconductor substrate 200.

A gate trench 216 crossing the active region 203a and extending to the trench isolation layer 209 may be provided.

The gate trench 216 may have a first bottom region N1 in the active region 203a adjacent to the trench isolation layer 209, a second bottom region N2 disposed at a lower level than the first bottom region N1 in the active region 203a adjacent to the first bottom region N1, and a third bottom region N3 disposed at a higher level than the second bottom region N2. Thus, a first region C1 of the active region 203a corresponding to the first bottom region N1 of the gate trench 216 may be more projected than a second region C2 of the active region 203a corresponding to the second bottom region N2, and a third region C3 of the active region 203a corresponding to the third bottom region N3 may be more projected than the second region C2.

However, the first bottom region N1 and the third bottom region N3 of the gate trench 216 may be disposed at the same level, or at different levels as according to design preference.

The gate trench 216 may have an inclined sidewall so that a lower region has a smaller area than an upper region in the active regions 203a as illustrated in FIG. 11.

The gate trench 216 may have a bottom region disposed at a lower level than the first bottom region N1 in the trench isolation layer 209.

A buried gate line 224 partially filling the gate trench 216 may be provided. The gate line 224 may cover all or a portion of the sidewalls of the active region 203a.

Meanwhile, a gate dielectric layer 221 may be interposed between the gate line 224 and the active region 203a. The gate dielectric layer 221 may be a silicon oxide layer or a high-k dielectric layer.

Source and drain regions 230 may be provided in the active region 203a adjacent to both sides of the gate line 224. Upper surfaces of the source and drain regions 230 may be disposed at a higher level than the gate line 224. An insulating pattern 227 may be provided on the gate line 224. The insulating pattern 227 may be, for example, a silicon oxide layer. The upper surfaces of the source and drain regions 230 and insulating layer 227 may be disposed at substantially the same level. The gate line 224 in the active region 203a may function as a gate electrode of a MOS transistor. Thus, a MOS transistor having the gate line 224, the gate dielectric layer 221 and the source and drain regions 230 may be provided. The gate trench 216 in the active region 203a, which is covered by the gate line 224, may have the first to third bottom regions, N1 to N3, respectively, disposed at different levels from each other, and thus form a triple-fin structure. That is, the MOS transistor may have a greater effective channel width than a planar-type transistor due to its fin structure. Thus, according to an exemplary embodiment of the invention, a MOS transistor which can improve on-current characteristics, body effect, and sub-threshold swing characteristics of a transistor as well as a short channel effect may be provided. Although not shown in this figure, a data storage element may be provided like in FIG. 5B, and electrically connected to one selected from the source and drain regions 230.

It should be apparent that while the exemplary embodiments of the invention described herein detail the use of a fin structure as illustrated, for example, in FIGS. 5A and 10, a different fin-like structure may be used according to design preference. For example, the upper and lower portions of the fins may be connected with an irregular taper to enable a contour that is reverse-tapered, hump-like or ball-like, or any variation thereof. Accordingly, one of ordinary skill in the art who has read and understood the aspects of the invention described herein will understand that various fin contours may be implemented without departing from the spirit and scope of this invention.

Methods of fabricating the semiconductor device according to the exemplary embodiments described above will be described below.

First, a method of fabricating a semiconductor device according to an exemplary embodiment of the invention will be described with reference to FIGS. 1, 2A, 2B, 3A, 3B, 4A, 4B, 5A and 5B.

Figure 2A:
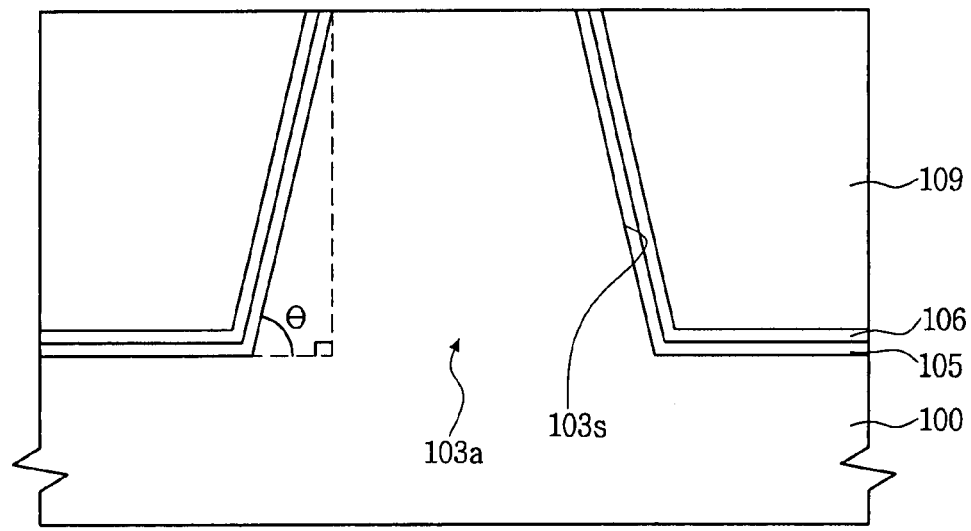
FIGS. 2A, 3A, 4A and 5A are cross-sectional views taken along line I-I' of FIG. 1 which illustrate a method of fabricating the semiconductor device having a buried gate line according to the exemplary embodiment of the invention.
Figure 2B:
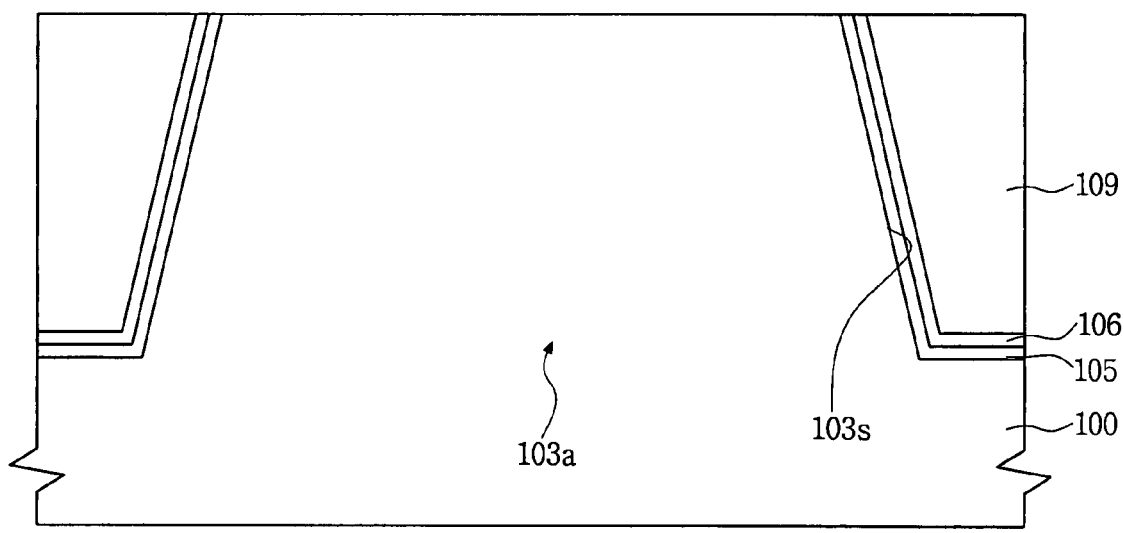
FIGS. 2B, 3B, 4B and 5B are cross-sectional views taken along line II-II' of FIG. 1 which illustrate the method of fabricating the semiconductor device having a buried gate line according to the exemplary embodiment of the invention.

Referring to FIGS. 1, 2A and 2B, a semiconductor substrate 100 is prepared. The semiconductor substrate 100 may be a single crystal silicon wafer or any material that is exhibits the appropriate semiconductor-like characteristics, whether single crystal or otherwise. An isolation trench 103s having an inclined sidewall may be formed on the semiconductor substrate 100 to define an active region 103a having an area gradually becoming larger from top to bottom. The isolation trench 103s may be formed to have a slope of Θ degrees. For example, the Θ may be 70 to 85 degrees. When the semiconductor substrate 100 is, for example, a single crystal silicon wafer, the isolation trench 103s may be formed by etching the semiconductor substrate 100 in a gas atmosphere including any one or more of $Cl_2$ gas, HBr gas and oxygen. Of course, other gases may be used according to design preference.

A buffer oxide layer 105 and an insulating liner 106 may be sequentially formed on an inner wall of the isolation trench 103s. The buffer oxide layer 105 is formed to cure etching damage to the semiconductor substrate 100 during the formation of the isolation trench. The buffer oxide layer 105 may be formed by thermally oxidizing the substrate having the isolation trench 103s. The insulating liner 106 may be formed, for example, of a silicon nitride layer by chemical vapor deposition or other suitable deposition method. The insulating liner 106 is formed to prevent oxidation of the semiconductor substrate contacting the inner wall of the isolation trench 103s by a subsequent thermal process for forming the semiconductor substrate. Also, the insulating liner 106 may prevent a reduction in area of the active region 103a due to oxidation by the subsequent thermal process.

A trench isolation layer 109 filling the isolation trench 103s whose inner wall is covered by the insulating liner 106 is formed. The formation of the trench isolation layer 109 may include forming an isolation insulating layer on the substrate having the isolation trench 103s, and planarizing the isolation insulating layer. The trench isolation layer 109 may be, for example, a silicon oxide layer.

Figure 3A:
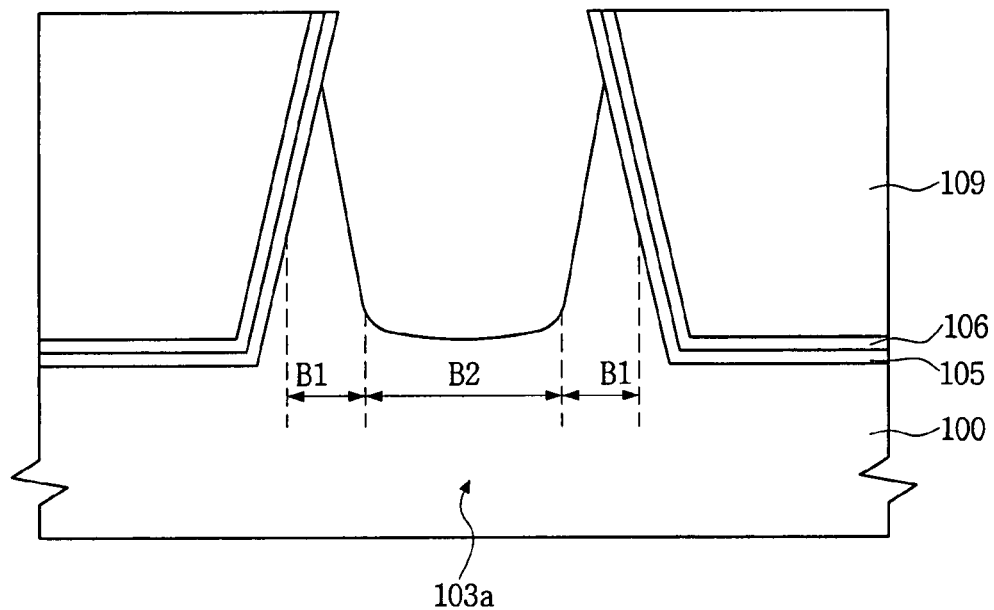
Figure 3B:
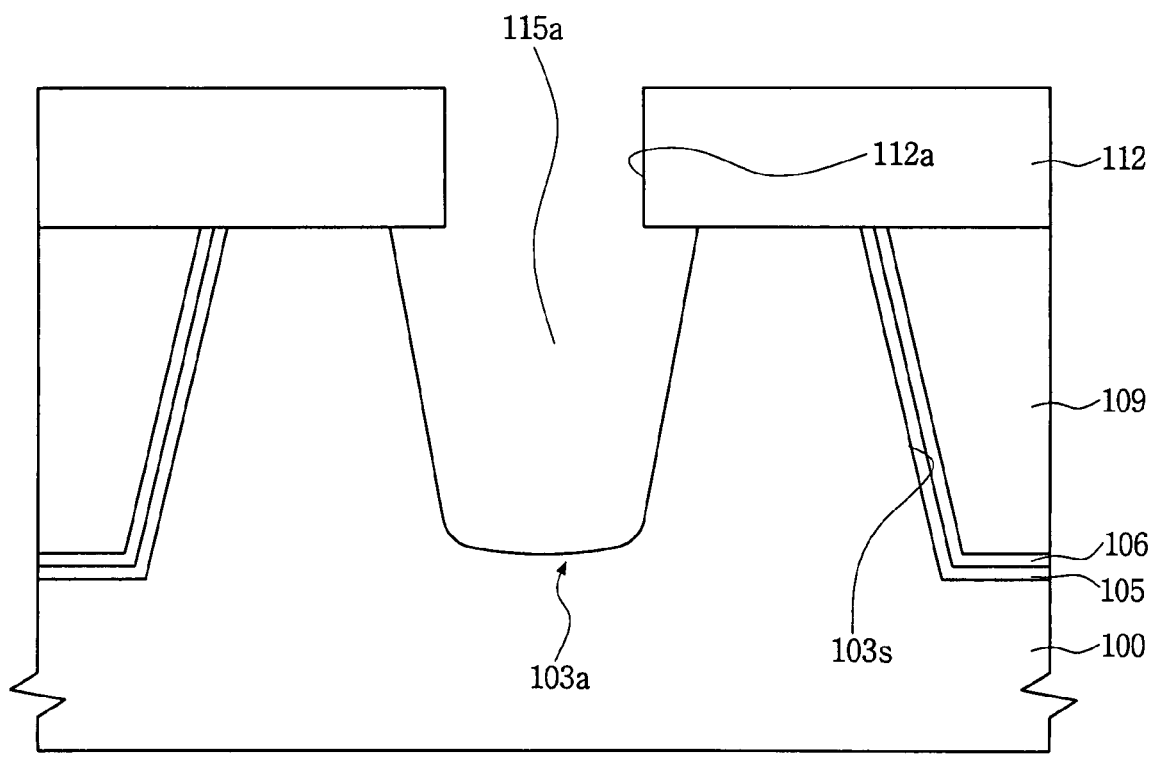

Referring to FIGS. 1, 3A and 3B, a mask 112 having an opening 112a extending to the trench isolation layer 109 across the active region 103a may be formed on the substrate having the trench isolation layer 109. The mask 112 may be formed of a photoresist layer or a hard mask pattern. For example, the hard mask pattern may include a silicon nitride layer.

The active region 103a may be etched using the mask 112 and the trench isolation layer 109 as etch masks to form an active trench 115a. Here, the active trench 115a may have an inclined sidewall resulting in a lower region being narrower than an upper region thereof. The active trench 115a may be formed, for example, by the etching process used for forming the isolation trench 103s, as described above.

Figure 4A:
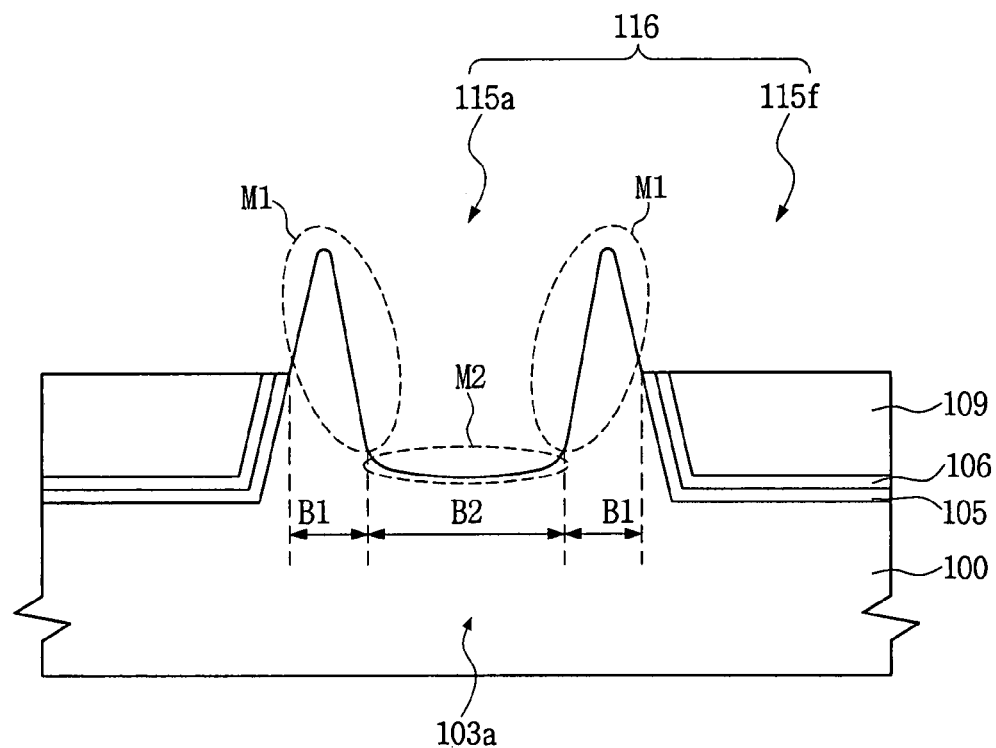
Figure 4B:
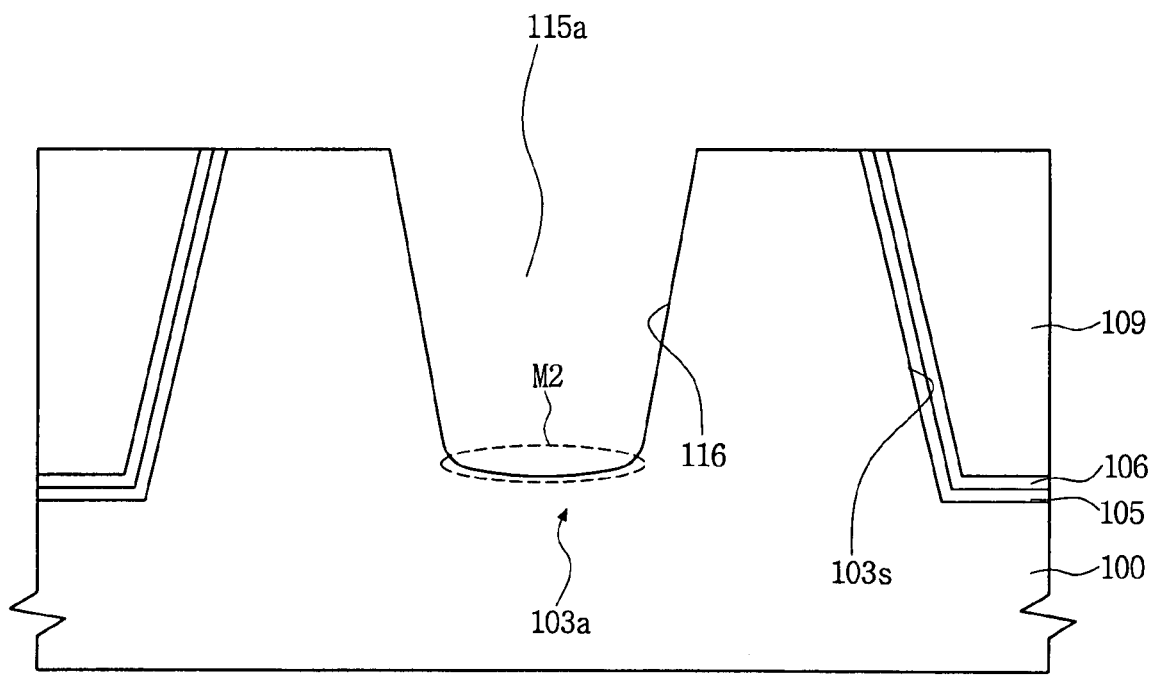

Referring to FIGS. 1, 4A and 4B, the trench isolation layer 109 may be etched using the mask 112 as an etch mask to form a field trench 115f. The field trench 115f may expose the sidewall of the active region 103a. When the trench isolation layer 109 is formed, for example, of a silicon oxide layer, the field trench 115f may be formed by etching the trench isolation layer 109 in a gas atmosphere including, for example, $C_4F_6$ gas, oxygen gas, $CHF_3$ gas and Ar gas. Other gases deemed suitable may be used according to design preference. As a result, a gate trench 116 having the active trench 115a and the field trench 115f may be formed.

The gate trench 116 may be formed to have a first bottom region M1 in the active region 103a adjacent to the trench isolation layer 109, and a second bottom region M2 disposed at a lower level than the first bottom region M1 in the active region 103a adjacent to the first bottom region M1. Thus, a first region B1 of the active region 103a, corresponding to the first bottom region M1 of the gate trench 116, may be more projected than a second region B2 of the active region 103a, corresponding to the second bottom region M2. Accordingly, the mask 112 may be removed.

Referring to FIGS. 1, 5A and 5B, a gate dielectric layer 121 may be formed on the substrate having the gate trench 116. The gate dielectric layer 121 may be a silicon oxide layer or a high-k dielectric layer. A gate line 124 partially filling the gate trench 116 may be formed on the substrate having the gate dielectric layer 121. The gate line 124 may include one selected, for example, from a group comprising of a poly silicon layer, a metal silicide layer, a metal layer and a combination thereof.

An insulating pattern 127 filling the rest of the gate trench 116 may be formed on the gate line 124. The insulating pattern 127 may be, for example, formed of a silicon oxide layer. The formation of the insulating pattern 127 may include forming an insulating layer filling the rest of the gate trench 116 and covering the semiconductor substrate 100, and planarizing the insulating layer. The insulating layer may be planarized by an etch-back process, if desired.

Source and drain regions 130 may be formed in the active region 103 adjacent to both sides of the gate line 124. Upper surfaces of the source and drain regions 130 may be disposed at a higher level than the gate line 124.

An interlayer insulating layer 132 may be formed on the substrate having the source and drain regions 130. A contact plug 133 passing through the interlayer insulating layer 132 and electrically connected to one of the source and drain regions 130 may be formed. A data storage element 136 covering the contact plug 133 may be formed on the interlayer insulating layer 132. The data storage element 136 may include a lower electrode, a capacitor dielectric layer and an upper electrode to be employed in a volatile memory device such as a DRAM, or may include a lower electrode, a phase change material layer and an upper electrode to be employed in a non-volatile memory device such as a PRAM. Other elements, whether storage-capable or not may be implemented according to design preference.

Next, a method of fabricating a semiconductor device according to another exemplary embodiment of the invention will be described with reference to FIGS. 6 to 11.

Figure 7:
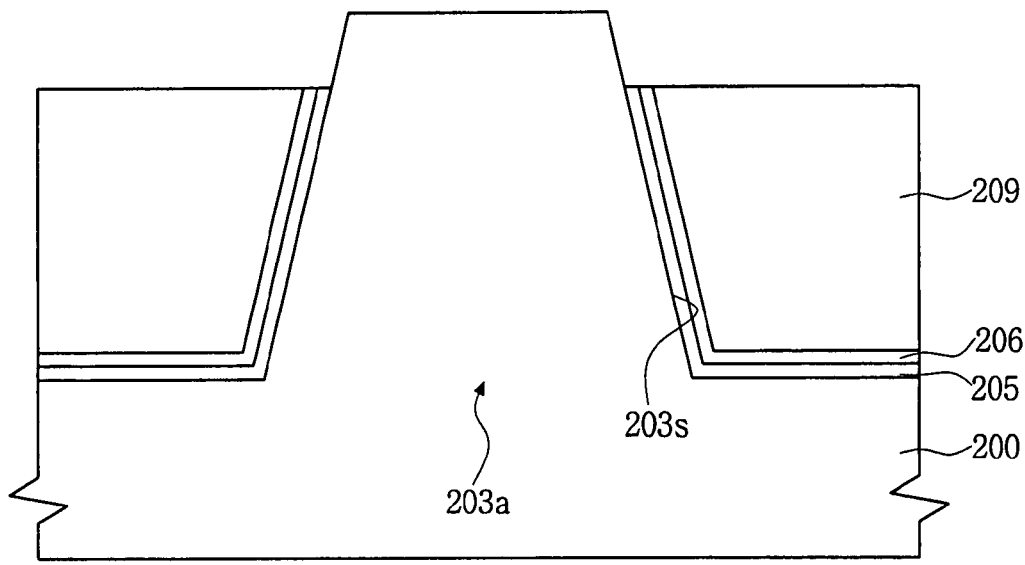
FIGS. 7 to 11 are cross-sectional views illustrating a method of fabricating the semiconductor device having a buried gate lined according to another exemplary embodiment of the invention.

Referring to FIGS. 6 and 7, a semiconductor substrate 200 is prepared, which may be a single crystal silicon wafer. An isolation trench 203s having an inclined sidewall may be formed to define an active region 203a having an area gradually becoming larger from top to bottom on the semiconductor substrate 200. The isolation trench 203s may be formed by the same process as that of forming the isolation trench 103s according to the above described exemplary embodiment(s) of the invention.

A buffer oxide layer 205 and an insulating liner 206 may be sequentially formed on an inner wall of the isolation trench 203s. A trench isolation layer 209 filling the isolation trench 203s whose inner wall is covered by the insulating liner 206 is formed. The trench isolation layer 209 may be, for example, a silicon oxide layer. Thus, the trench isolation layer 209 may have an inclined sidewall.

A mask having an opening extending to the trench isolation layer 209 across the active region 203a may be formed. The mask is formed by substantially the same process as that of forming the mask 112 according to the above described exemplary embodiment(s) of the invention. The trench isolation layer 209 may be partially etched using the mask and the active region 203a as etch masks. As a result, an upper region of the active region 203a may be exposed.

Figure 8:
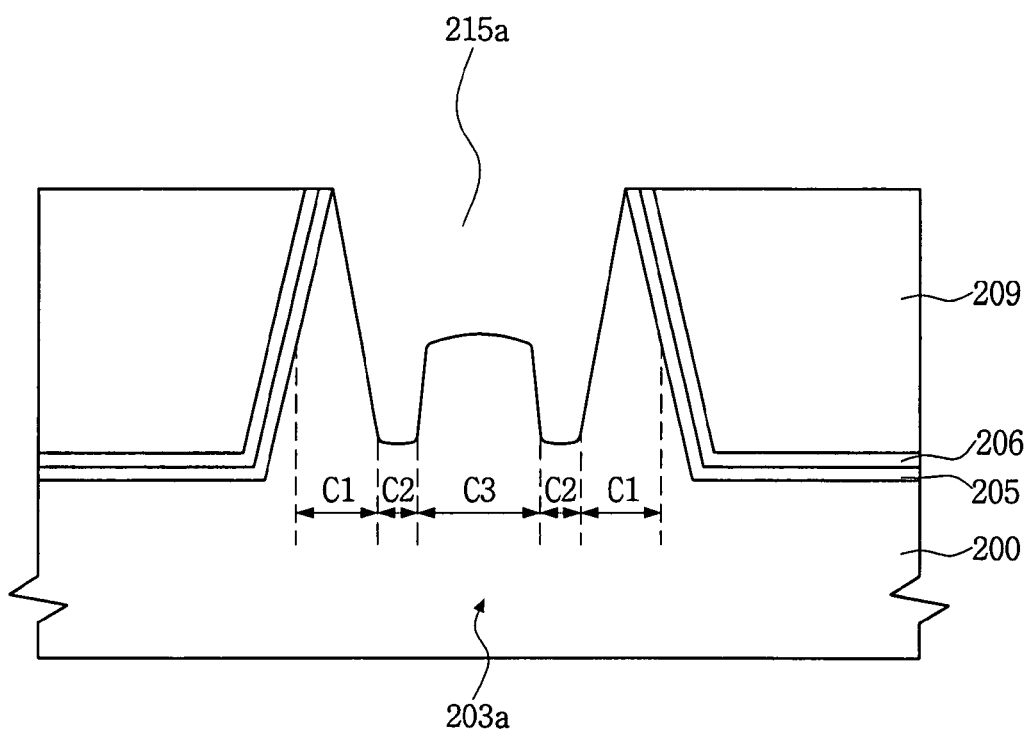

Referring to FIGS. 6 and 8, the active region 203a may be etched using the mask and the partially etched trench isolation layer 209 as etch masks to form an active trench 215a. When seen along line III-III' of FIG. 6, the active region 203a may be formed to be projected in the middle thereof. This projection arises because if the etching process is performed while the upper region of the active region 203a is exposed by the mask and the partially etched trench isolation layer 209, as illustrated in FIG. 7, there is a difference in depth between the depth obtained by etching the active region 203a adjacent to the upper surface of the partially etched trench isolation layer 209 and the depth obtained by etching the upper region of the active region 203a exposed by the mask and the partially etched trench isolation layer 209. That is, the depth obtained by etching the active region 203a adjacent to the upper surface of the partially etched trench isolation layer 209 may be deeper. Since the trench isolation layer 209 may have an inclined sidewall, the active region 203a overlapping the inclined sidewall of the trench isolation layer 209 may remain. FIG. 8 is a cross-sectional view taken along line III-III' of FIG. 6, and shows a bottom region of the active trench 215a. Accordingly, as illustrated in FIG. 8, the bottom region of the active trench 215a in the active region 203a may have a "W" shaped profile.

Figure 9:
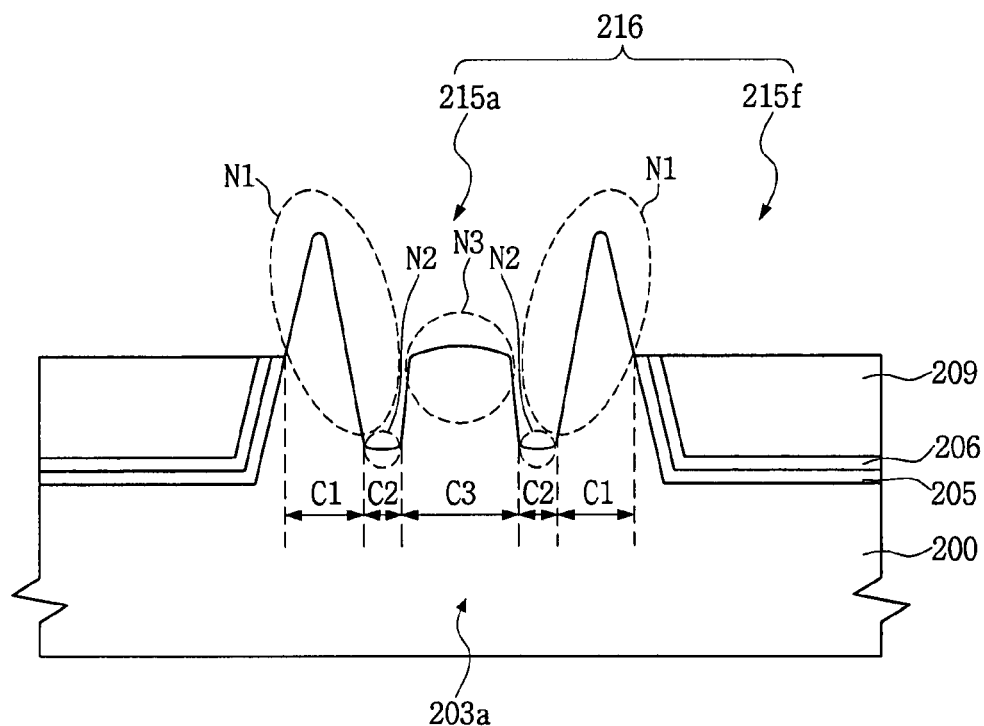

Referring to FIGS. 6 and 9, the partially etched trench isolation layer 209 may be etched using the mask as an etch mask to form a field trench 215f. Thus, a gate trench 216 having the field trench 215f and the active trench 215a may be formed.

The sidewall of the active region 203a may be exposed by the field trench 215f.

The surface of the active region 203a exposed by the gate trench 216 is cleaned, and a pointed part of the active region 203a may be etched to have a more rounded appearance.

Consequently, the gate trench 216 may have a first bottom region N1 in the active region 203a adjacent to the trench isolation layer 209, a second bottom region N2 disposed at a lower level than the first bottom region N1 in the active region 203a adjacent to the first bottom region N1, and a third bottom region N3 disposed at a higher level than the second bottom region N2. Thus, a first region C1 of the active region 203a, corresponding to the first bottom region N1 of the gate trench 216, may be more projected than a second region C2 of the active region 203a, corresponding to the second bottom region N2, and a third region C3 of the active region 203a, corresponding to the third bottom region N3, may be more projected than the second region C2.

The first and third bottom regions N1 and N3 of the gate trench 216 may be disposed at substantially the same level, or at different levels. For example, the levels of the first bottom region N1 and the third bottom region N3 may be determined by the depth of the trench isolation layer 209, which may be controlled by partially etching the trench isolation layer 209, and using a mask and the active region 203a as etch masks to expose the upper region of the active region 203a. Then, the mask(s) may be removed.

Referring to FIGS. 6, 10 and 11, a gate dielectric layer 221 may be formed on the substrate having the gate trench 216. The gate dielectric layer 221 may be, for example, a silicon oxide layer or a high-k dielectric layer. A gate line 224 partially filling the gate trench 216 may be formed on the substrate having the gate dielectric layer 221.

An insulating pattern 227 filling the rest of the gate trench 216 may be formed on the gate line 224. The insulating pattern 227 may be formed of a silicon oxide layer. The formation of the insulating pattern 227 may include forming an insulating layer filling the rest of the gate trench 216 and covering the semiconductor substrate 200, and then planarizing the insulating layer. The insulating layer may be planarized, for example, by an etch-back process.

Source and drain regions 230 may be formed in the active region 203a adjacent to both sides of the gate line 224. The upper surfaces of the source and drain regions 230 may be disposed at a higher level than the gate line 224.

A data storage element, which is not illustrated, electrically connected to one selected from the source and drain regions 230 may be formed as necessary.

Consequently, a buried gate line is provided using a gate trench extending to a trench isolation layer across an active region. The gate trench in the active region may have bottom regions disposed at different levels from each other. Thus, a semiconductor device having an effective channel width and length which are relatively greater than conventional transistors can be realized.

Exemplary embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A semiconductor device comprising:
    trench isolation layers disposed in a semiconductor substrate and defining an active region;
    a gate trench extending between the trench isolation layers and comprising: a first bottom region proximal to the trench isolation layers and disposed on opposing sides of a second bottom region, wherein an upper surface of the second bottom region is disposed more deeply in the active region that an upper surface of the first bottom region;
    a gate line disposed across the active region, and partially filling the gate trench; and
    an insulating pattern disposed on the gate line.

2. The semiconductor device according to claim 1, wherein the trench isolation layers are formed with inclined sidewall surfaces, such that an upper width of the active region is smaller than a lower width of the active region.

3. The semiconductor device according to claim 1, wherein the gate trench further comprises:
    a third bottom region centrally disposed in the second bottom region, wherein an upper surface of the third bottom region is disposed at a higher level above the semiconductor substrate than an upper surface of the second bottom region.

4. The semiconductor device according to claim 1, wherein the gate line covers portions of a sidewall of the active region.

5. The semiconductor device according to claim 1, further comprising a gate dielectric layer interposed between the gate line and the active region.

6. A semiconductor device comprising:
    a trench isolation layer disposed in a semiconductor substrate and defining an active region;
    a gate trench extending from the trench isolation layer and comprising; a first region proximal to the trench isolation layer and a second region proximal to the first region, wherein a bottom of the second region is at a level lower than a bottom of the first region;
    a gate line across the active region, filling a portion of the gate trench;
    an insulating pattern provided on the gate line; and
    source and drain regions provided in the active region adjacent to both sides of the gate line, upper surfaces of the source and drain regions being disposed at a higher level than the gate line.

7. The semiconductor device according to claim 6, wherein the upper surfaces of the source and drain regions and the insulating pattern are disposed at the same level.

8. The semiconductor device according to claim 6, further comprising a data storage element electrically connected to one of the source and drain regions.

9. A semiconductor device comprising:
    an active region formed in a semiconductor substrate and having sidewalls inclined in one direction to define an upper active region having a first width and a lower active region having a second width greater than the first width;
    a gate trench formed in the active area and having sidewalls inclined in a direction opposite to the one direction to define an opening having a bottom region less wide than an upper region;
    a gate dielectric layer disposed on the sidewalls of the gate trench;
    a gate line disposed in the gate trench on the gate dielectric to partially fill the gate trench; and
    an insulating pattern disposed over the gate line.

10. The semiconductor device of claim 9, further comprising:
    source and drain regions formed in the upper active region on opposing sides of the gate trench, wherein upper surfaces of the source and drain regions are disposed above the gate line.

11. The semiconductor device of claim 9, further comprising:
    opposing trench isolation layers formed in the semiconductor substrate and defining the active region.

12. The semiconductor device of claim 11, further comprising:
    an insulating liner and a buffer oxide layer interposed between each one of the opposing trench isolation regions.

13. The semiconductor device of claim 9, wherein the bottom region of the gate trench comprises a centrally projected region rising above a bottom surface of the bottom region.

14. The semiconductor device of claim 9, wherein the centrally projected region comprises a portion of the active region extending upward into the gate trench.

* * * * *